(12) United States Patent
Tseng et al.

(10) Patent No.: US 11,694,983 B2
(45) Date of Patent: Jul. 4, 2023

(54) TEST PAD STRUCTURE OF CHIP

(71) Applicant: SITRONIX TECHNOLOGY CORP., Jhubei (TW)

(72) Inventors: Kuo-Wei Tseng, Jhubei (TW); Po-Chi Chen, Jhubei (TW)

(73) Assignee: Sitronix Technology Corporation, Jhubei (TW)

( * ) Notice: Subject to any disclaimer, the term of this patent is extended or adjusted under 35 U.S.C. 154(b) by 0 days.

(21) Appl. No.: 17/444,233

(22) Filed: Aug. 2, 2021

(65) Prior Publication Data
US 2022/0037218 A1 Feb. 3, 2022

Related U.S. Application Data

(60) Provisional application No. 63/059,178, filed on Jul. 31, 2020.

(51) Int. Cl.
| | | |
|---|---|---|
| *H01L 23/58* | (2006.01) | |
| *H01L 23/00* | (2006.01) | |
| *H01L 21/66* | (2006.01) | |

(52) U.S. Cl.
CPC ............. *H01L 24/13* (2013.01); *H01L 22/32* (2013.01); *H01L 24/06* (2013.01); *H01L 24/14* (2013.01); *H01L 2224/0603* (2013.01); *H01L 2224/10145* (2013.01); *H01L 2224/13013* (2013.01); *H01L 2224/13023* (2013.01); *H01L 2224/1403* (2013.01); *H01L 2224/14051* (2013.01); *H01L 2224/14133* (2013.01)

(58) Field of Classification Search
CPC combination set(s) only.
See application file for complete search history.

(56) References Cited

U.S. PATENT DOCUMENTS

2001/0000013 A1* 3/2001 Lin .................. G01R 31/31905
257/E21.705

FOREIGN PATENT DOCUMENTS

| JP | S55141949 U | 10/1980 |
|---|---|---|
| JP | H0375531 U | 7/1991 |

(Continued)

OTHER PUBLICATIONS

Official Action for Foreign Corresponding Patent Application No. 110128415/11120443430.

(Continued)

*Primary Examiner* — Niki H Nguyen
(74) *Attorney, Agent, or Firm* — Rosenberg Klein & Lee

(57) ABSTRACT

The present invention provides a test pad structure of chip, which comprises a plurality of first internal test pads, a plurality of second internal test pads, a plurality of first extended test pads, and a plurality of second extended test pads. The first internal test pads and the second internal test pads are disposed in a chip. The second internal test pads and the first internal test pads are spaced by a distance. The first extended test pads are connected with the first internal test pads. The second extended test pads are connected with the second internal test pads. The first extended test pads and the second extended test pads may increase the contact area to be contacted by probes. Signals or power are transmitted to the first internal test pads and the second internal test pads via the first extended test pads and the second extended test pads for the probes to test the chip.

17 Claims, 9 Drawing Sheets

(56) References Cited

FOREIGN PATENT DOCUMENTS

| | | | |
|---|---|---|---|
| JP | 2005294626 | A | 10/2005 |
| TW | 200617398 | A | 6/2006 |
| TW | 200622273 | A | 7/2006 |
| TW | 202004881 | A | 1/2020 |

OTHER PUBLICATIONS

Search Report for Foreign Corresponding Patent Application No. 110128415/11120443430.
Official Action Issued by Foreign Patent Office in Corresponding Application No. 2021-126948.

* cited by examiner

TEST PAD STRUCTURE OF CHIP

FIELD OF THE INVENTION

The present invention relates generally to a test pad structure of chip, and particularly to a test pad structure that capable of guaranteeing probe contact.

BACKGROUND OF THE INVENTION

With the development of the times, IC design houses design circuits and circuit layouts according to customers' needs and product functions and provide the designs to foundries for chip fabrication. After chips are fabricated and before they are cut from wafers, to ensure normal operations and expected functions of the circuits of the chips on the wafer, the chip probing must be performed on wafers to guarantee the quality of each chip.

The testing apparatus of wafers includes a probe card. The probe card includes a plurality of probes. The probes will contact the test pads on chips for transmitting signals or power to the chips and testing their functionality.

Please refer to FIG. 1, which shows a cross-sectional view of the test pad structure according to the prior art. As shown in the figure, a wafer 70 includes a plurality of chips 80. Each chip 80 includes a plurality of test pads 82 and a plurality of openings 84. The test pads 82 are located inside the chip 80. The openings 84 correspond to the test pads 82 and communicate with the test pads 82 and the surface of the chip 80. The two probes 42 of a testing apparatus 40 will enter the openings 84 and contact the test pads 82 for transmitting signals or power to the chips 80 and testing the chips 80. Unfortunately, owing to process errors such as etch errors or alignment errors of masks, the cross-sectional areas of the openings 84 might be large than and approximate to the cross-sectional areas of the probes 42, making the probes 42 difficult to enter the openings 84. Given that the contact to the test pads 82 is difficult or not firm, the testing quality will be affected. Moreover, the cross-sectional areas of the openings 84 might be smaller than the cross-sectional areas of the probes 42, making the probes 42 cannot enter the openings 84. In addition, if the locations of the openings 84 deviate, the distance between two adjacent openings 84 will deviate by a predetermined distance. Then the two probes 42 will not be aligned to two adjacent openings 84 concurrently, making the probes 42 cannot enter the openings 84. Once the probes 42 cannot enter the openings 84, it is not possible to test the chip 80.

Based on the above description, it is known that the test pad structure according to the prior art will affect the testing quality of the testing apparatus or even lead to inability in testing chips. Accordingly, it is urged to provide a structure that may guarantee probes contact to the test pads on chips for enhancing testing quality.

SUMMARY

An objective of the present invention is to provide a test pad structure of chip, which comprises a plurality of internal test pads and a plurality of extended test pads. The extended test pads are connected with the internal test pads for increasing the area to be contacted by the probes. Thereby, the probes may contact the extended test pads solidly. Signals or power are transmitted to the internal test pads via the extended test pads for testing chips. Thereby, the testing quality may be enhanced.

Another objective of the present invention is to provide a test pad structure of chip with increased area to be contacted by the probes. When the cross-sectional area of the probes is increased due to wear, the probes still may contact the test pad structure without replacement. Thereby, the lifetime of the probes may be increased and hence reducing the testing cost.

Still another objective of the present invention is to provide a test pad structure of chip with increased area to be contacted by the probes. With a larger range of alignment, the probes may be aligned to the test pad structure with ease and hence improving the alignment problem.

The present invention provides a test pad structure of chip, which comprises a plurality of first internal test pads, a plurality of second internal test pads, a plurality of first extended test pads, and a plurality of second extended test pads. The first internal test pads and the second internal test pads are disposed in a chip. The second internal test pads and the first internal test pads are spaced by a distance. The first extended test pads and the second extended test pads are disposed on the chip. The first extended test pads are connected with the first internal test pads and located above the first internal test pads. The second extended test pads are connected with the second internal test pads and located above the second internal test pads. The first extended test pads and the second extended test pads may increase the contact area to be contacted by the probes. Thereby, the probes may firmly contact the first extended test pads and the second extended test pads. Signals or power are transmitted to the first internal test pads and the second internal test pads via the first extended test pads and the second extended test pads for the probes to test the chip.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
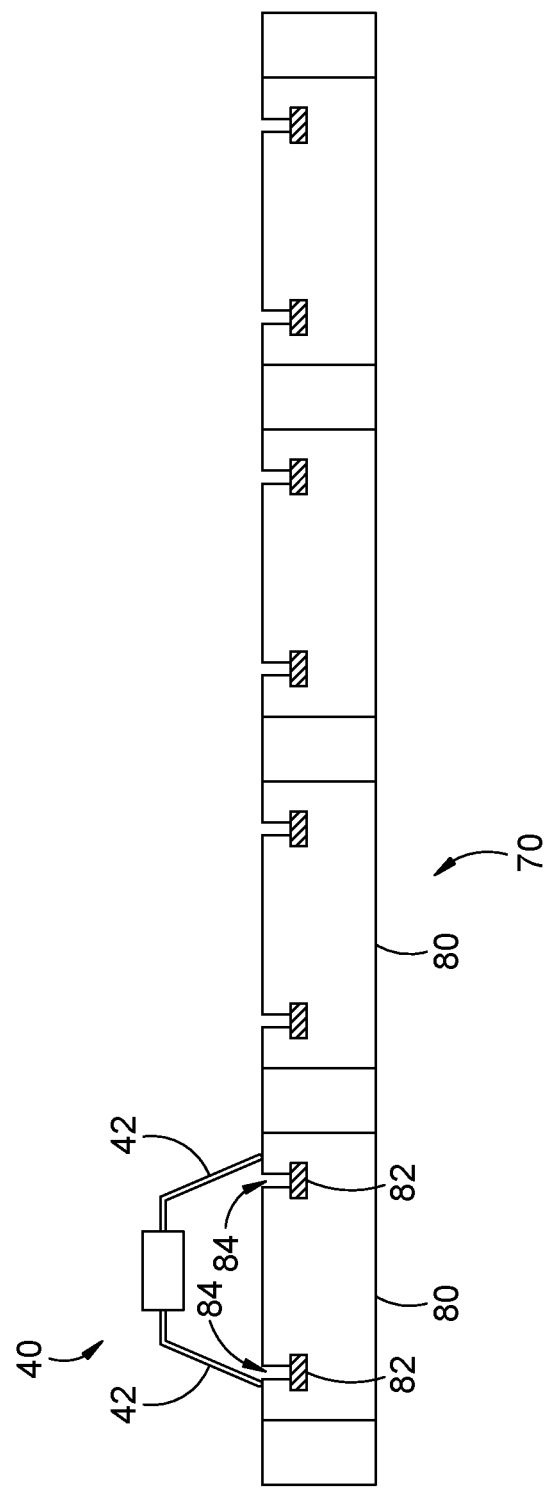
FIG. 1 shows a cross-sectional view of the test pad structure according to the prior art.
Figure 2:
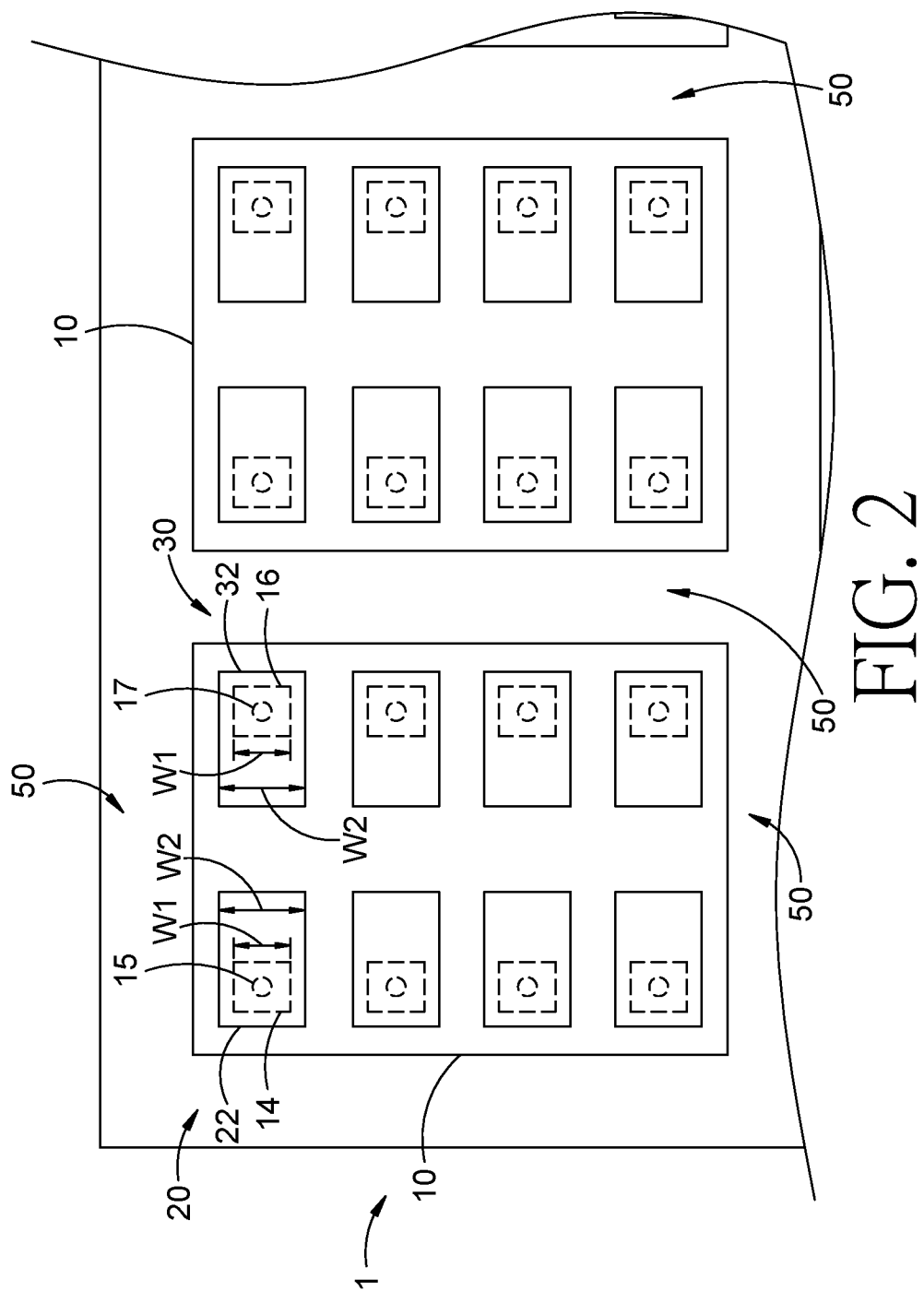
FIG. 2 shows a top view of the test pad structure of chip according to the first embodiment of the present invention.
Figure 3:
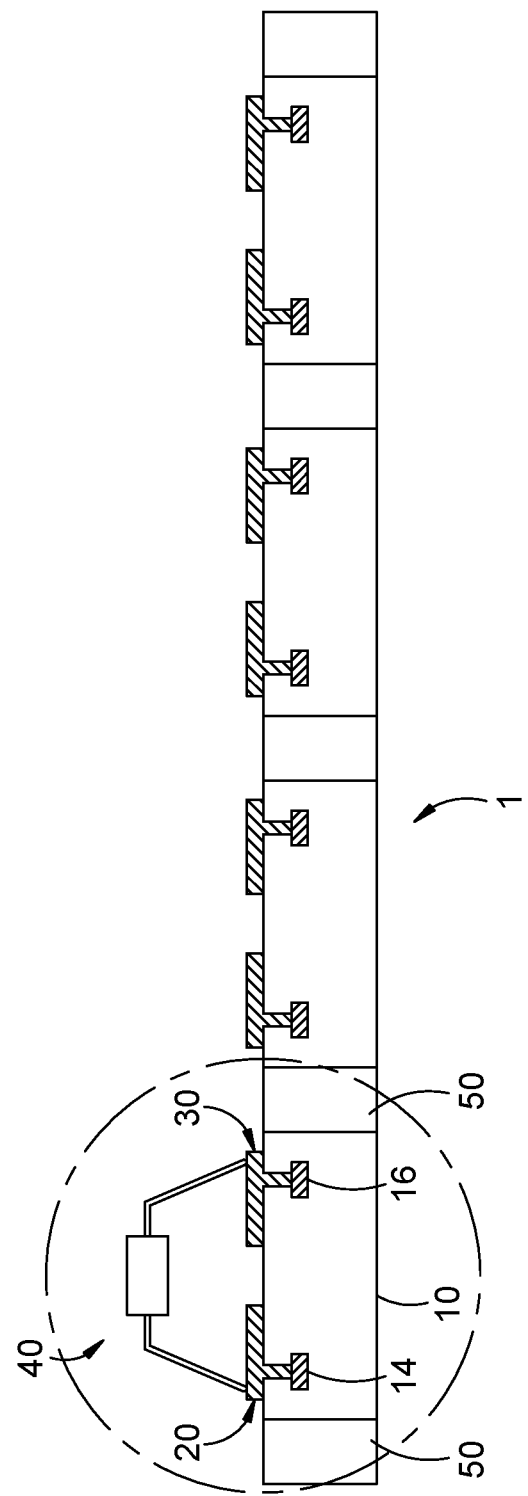
FIG. 3 shows a cross-sectional view of the test pad structure of chip according to the first embodiment of the present invention.

Please refer to FIG. 2 and FIG. 3, which show a top view and a cross-sectional view of the test pad structure of chip according to the first embodiment of the present invention, respectively. As shown in the figures, a wafer 1 includes a plurality of chips 10 and a plurality of scribe lanes 50. The scribe lanes 50 are located between the chips 10. A wafer dicing machine may cut the wafer 1 along the scribe lanes 50 to give the chips 10.

Figure 4A:
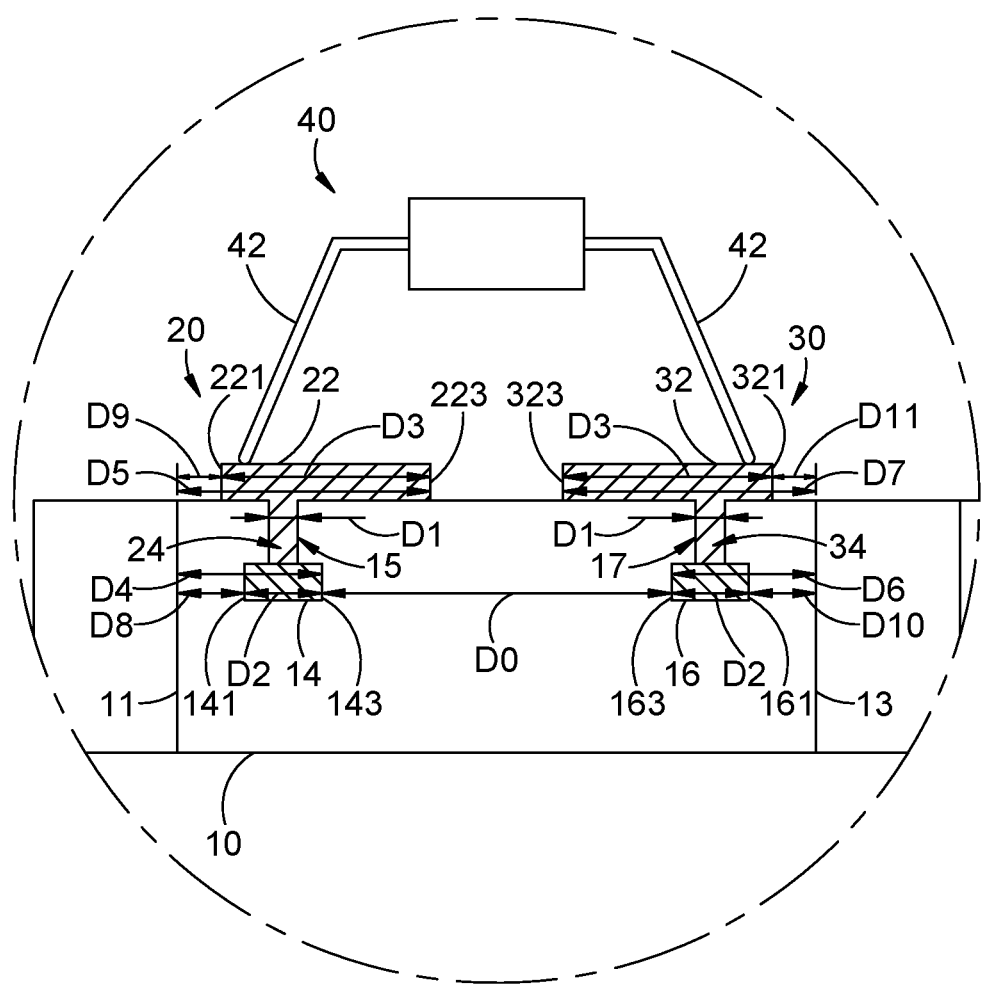
FIG. 4A and FIG. 4B show partially enlarged views of FIG. 3.

Please refer again to FIG. 2 and FIG. 3 and to FIG. 4A. FIG. 4A shows a partially enlarged view of FIG. 3. The test pad structure according to the present invention comprises a plurality of first internal test pads 14, a plurality of second internal test pads 16, a plurality of first extended test pads 20, and a plurality of second extended test pads 30 all disposed in or on the chip 10. According to an embodiment, the first internal test pads 14 and the second internal test pads 16 are located inside the chip 10. The first internal test pads 14 are located on a first side of the chip 10; the second internal test pads are located on a second side of the chip 10. The first internal test pads 14 include a first side surface 141 and a second side surface 143. The second internal test pads 16 include a first side surface 161 and a second side surface 163. The second side surface 143 is opposite to the second side surface 163 and the second side surface 143 and the second side surface 163 are spaced by a distance D0, meaning that the distance between the first internal test pads 14 and the second internal test pads 16 is the distance D0. The first extended test pads 20 are connected to the first internal test pads 14, respectively, and located above the first internal test pads 14. The second extended test pads 30 are connected to the second internal test pads 16, respectively, and located above the second internal test pads 16.

Please refer again to FIG. 2 and FIG. 4A. According to the present embodiment, the chip 10 includes a plurality of first holes 15 and a plurality of second holes 17. The first holes 15 correspond to the first internal test pads 14 and located on the first internal test pads 14. The second holes 17 correspond to the second internal test pads 16 and located on the second internal test pads 16. The first extended test pads 20 include a first body 22 and a first connecting member 24, respectively. The first body 22 is located on the surface of the chip 10. The first connecting member 24 is inserted into the first hole 15. The first connecting member 24 is connected with the first body 22 and the first internal test pad 14. The second extended test pads 30 and the first extended test pads 20 are spaced by a distance. The second extended test pads 30 include a second body 32 and a second connecting member 34, respectively. The second body 32 is located on the surface of the chip 10. The second connecting member 34 is inserted into the second hole 17. The second connecting member 34 is connected with the second body 32 and the second internal test pad 16.

According to the present embodiment, the first body 22 extends toward the second body 32, meaning that the first extended test pad 20 extends toward the second extended test pad 30. The second body 32 extends toward the first body 22, meaning that the second extended test pad 30 extends toward the first extended test pad 20. As shown in FIG. 4A, the second side surface 143 of the first internal test pad 14 is more distant from the first side surface 11 of the chip 10 than the first side surface 141 of the first internal test pad 14. The first body 22 of the first extended test pad 20 includes a first side surface 221 and a second side surface 223. The second side surface 223 is more distant from the first side surface 11 of the chip 10 than the first side surface 221. The second side surface 143 of the first internal test pad 14 and the first side surface 11 of the chip 10 are spaced by a distance D4; the second side surface 223 of the first extended test pad 20 and the first side surface 11 of the chip 10 are spaced by a distance D5. The distance D5 is greater than the distance D4. The second side surface 163 of the second internal test pad 16 is more distant from the second side surface 13 of the chip 10 than the first side surface 161 of the second internal test pad 16. The second body 32 of the second extended test pad 30 includes a first side surface 321 and a second side surface 323. The second side surface 323 is more distant from the second side surface 13 of the chip 10 than the first side surface 321. The second side surface 323 is opposite to the second side surface 223. The second side surface 163 of the second internal test pad 16 and the second side surface 13 of the chip 10 are spaced by a distance D6; the second side surface 323 of the second extended test pad 30 and the second side surface 13 of the chip 10 are spaced by a distance D7. The distance D7 is greater than the distance D6.

Please refer again to FIG. 4A. The first side surface 141 of the first internal test pad 14 and the first side surface 11 of the chip 10 are spaced by a distance D8; the first side surface 221 of the first extended test pad 20 and the first side surface 11 of the chip 10 are spaced by a distance D9. The distance D9 is smaller than the distance D8, meaning that the first extended test pad 20 also extends away from the second extended test pad 30. The first side surface 161 of the second internal test pad 16 and the second side surface 13 of the chip 10 are spaced by a distance D10; the first side surface 321 of the second extended test pad 30 and the second side surface 13 of the chip 10 are spaced by a distance D11. The distance D11 is smaller than the distance D10, meaning that the second extended test pad 30 also extends away from the first extended test pad 20.

As shown in FIG. 4A, the first hole 15 and the second hole 17 have a diameter D1, respectively, representing the opening size of the first hole 15 and the second hole 17. The first internal test pad 14 and the second internal test pad 16 have a length D2, respectively. The length of the first internal test pad 14 and the length of the second internal test pad 16 may be different. The first body 22 and the second body 32 have a length D3, respectively. The length D3 is greater than the diameter D1 and the length D2, meaning that the top surface area of the first body 22, namely, the surface area of the first extended test pad 20, is greater than the opening area of the first hole 15 and the surface area of the first internal test pad 14, as shown in FIG. 3. Likewise, the top surface area of the second body 32, namely, the surface area of the second extended test pad 30, is greater than the opening area of the second hole 17 and the surface area of the second internal test pad 16, as shown in FIG. 3. According to an embodiment, the length of the first body 22 and the length of the second body 32 may also be different. Besides, as shown in FIG. 2, the first internal test pad 14 and the second internal test pad 16 have a width W1, respectively. The width of the first internal test pad 14 and the width of the second internal test pad 16 may also be different. The first body 22 and the second body 32 have a width W2, respectively. The width W2 is greater than the width W1. According to an embodiment, the width W2 may be equal to the width W1, and the width of the first body 22 and the width of the second body 32 may also be different.

Figure 4B:
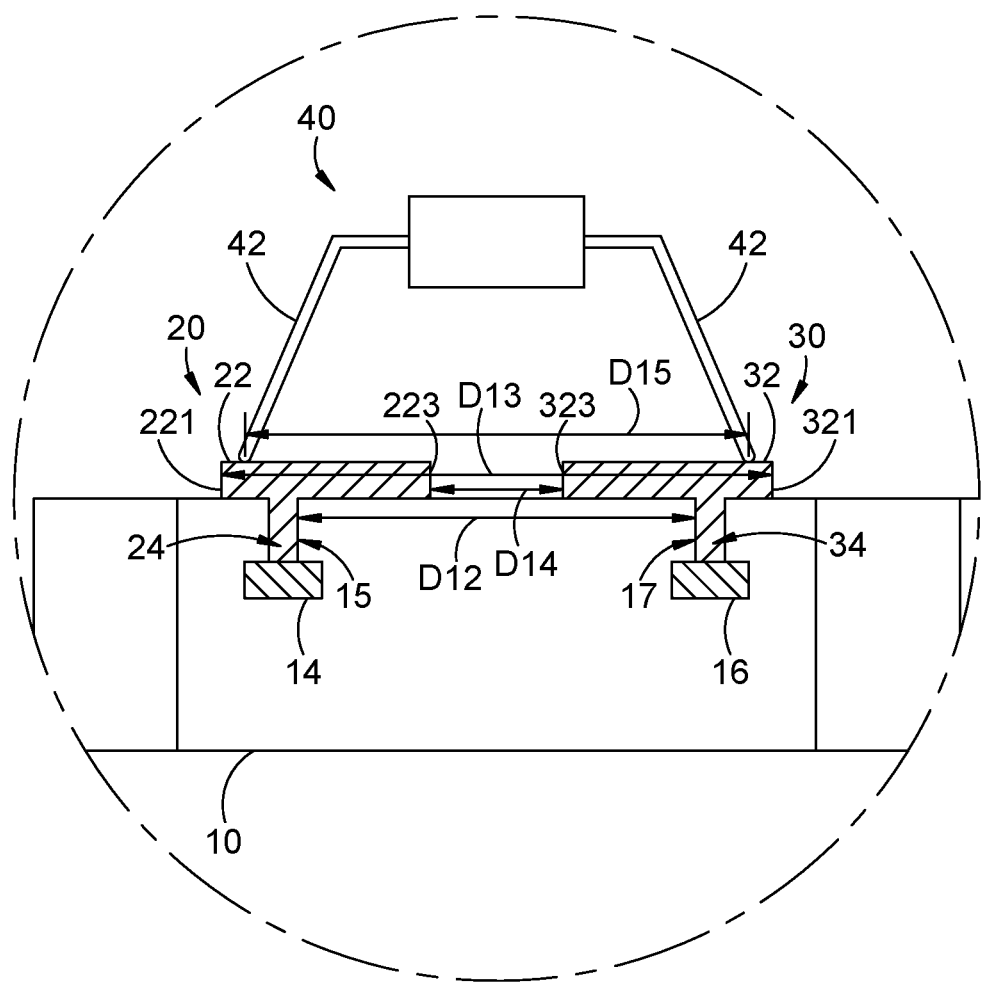

Please refer again to FIG. 2 and to FIG. 4B. Like FIG. 4A, FIG. 4B shows a partially enlarged view of FIG. 3. As shown in the figures, a testing apparatus 40 is used for testing the chip 10 and includes two probes 42. The two probes 42 may contact the first body 22 of the first extended test pad 20 and the second body 32 of the second extended test pad 30. The first hole 15 and the second hole 17 are spaced by a distance D12. The first side surface 221 of the first extended test pad 20 and the first side surface 321 of the second extended test pad 30 are spaced by a first test distance D13; the second side surface 223 of the first extended test pad 20 and the second side surface 323 of the second extended test pad 30 are spaced by a second test distance D14. The first test distance D13 is greater than the second test distance D14. The two probes 42 are spaced by a probe distance D15. According to the present embodiment, the distance D12 and the second test distance D14 are smaller than the probe distance D15; the first test distance D13 is greater than the probe distance D15. The two probes 42 may contact the surfaces of the first extended test pad 20 and the second extended test pad 30. Signals or power may be transmitted to the first internal test pad 14 and the second internal test pad 16 via the first extended test pad 20 and the second extended test pad 30 for testing the chip 10.

According to the above description, it is not necessary for the probes 42 to enter the holes 15, 17. Instead, the probes 42 only need to contact the first extended test pad 20 and the second extended test pad 30 for testing the chip 10. In other words, the area to be contacted by the probes 42 is increased. In addition, the area of the first extended test pad 20 and the second extended test pad 30 may be greater than the area of the first internal test pad 14 and the second internal test pad 16 for further increasing the area to be contacted by the probes 42. Furthermore, a larger area of the first extended test pad 20 and the second extended test pad 30 to be contacted by the probes 42 means a larger alignment range for the probes 42. Even if the probe distance D15 between the two probes 42 is increased or decreased owing to long-term usage, the probes 42 still may be aligned to the first extended test pad 20 and the second extended test pad 30 and no replacement of the probes 42 is required. Besides, when the cross-sectional area of the probes 42 is increased due to wear, the probes 42 still may contact the first extended test pad 20 and the second extended test pad 30 firmly and no replacement of the probes 42 is needed. Thereby, the lifetime of the probes 42 may be increased and the testing costs may be reduced.

Figure 5:
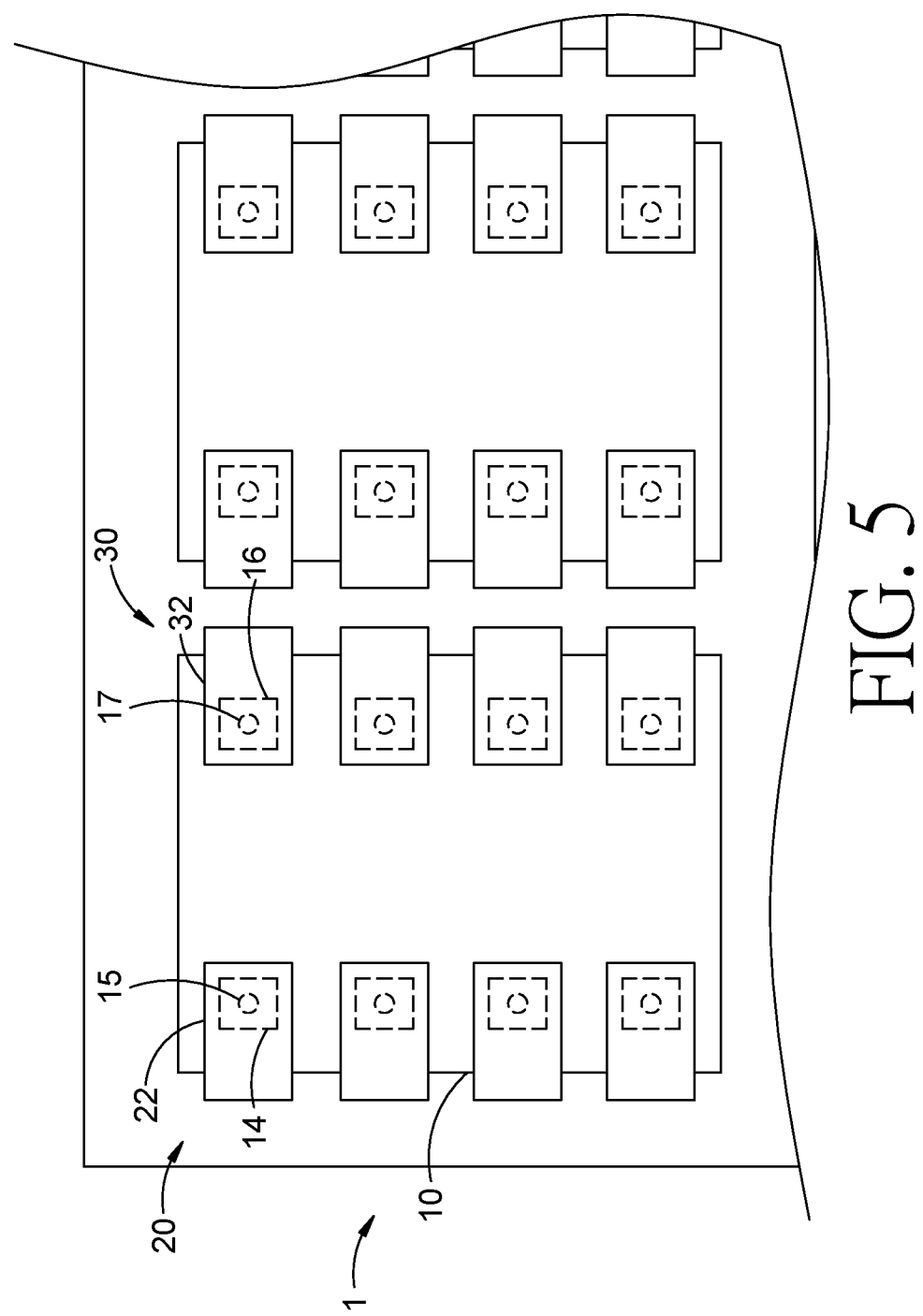
FIG. 5 shows a top view of the test pad structure of chip according to the second embodiment of the present invention.
Figure 6:
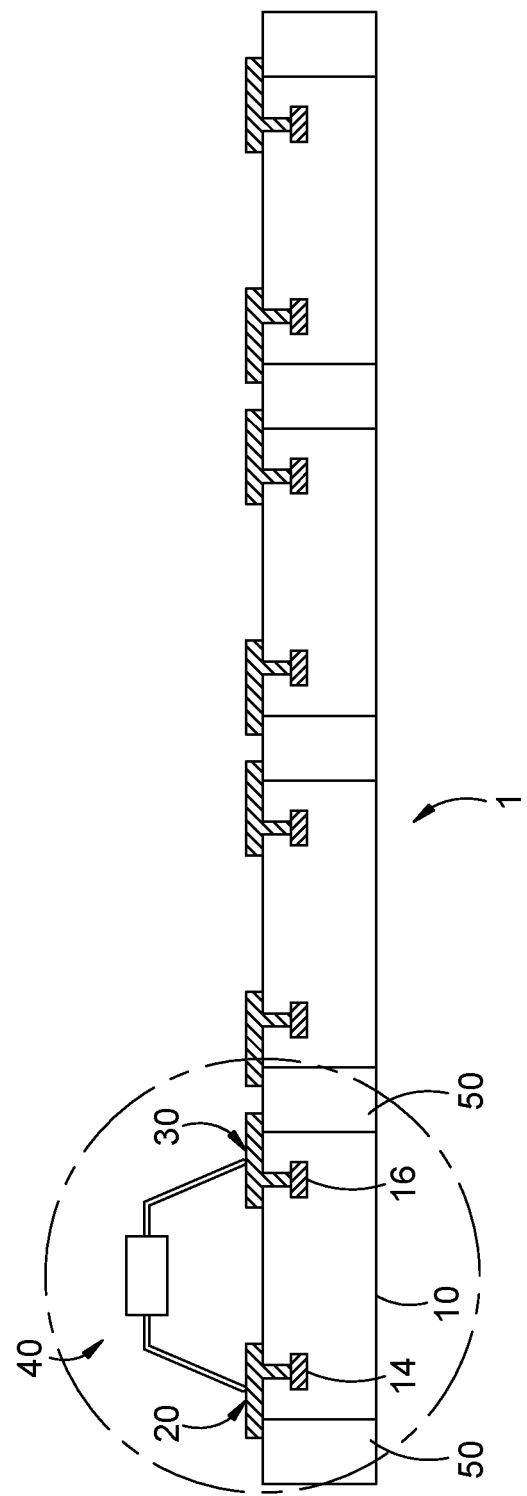
FIG. 6 shows a cross-sectional view of the test pad structure of chip according to the second embodiment of the present invention.
Figure 7:
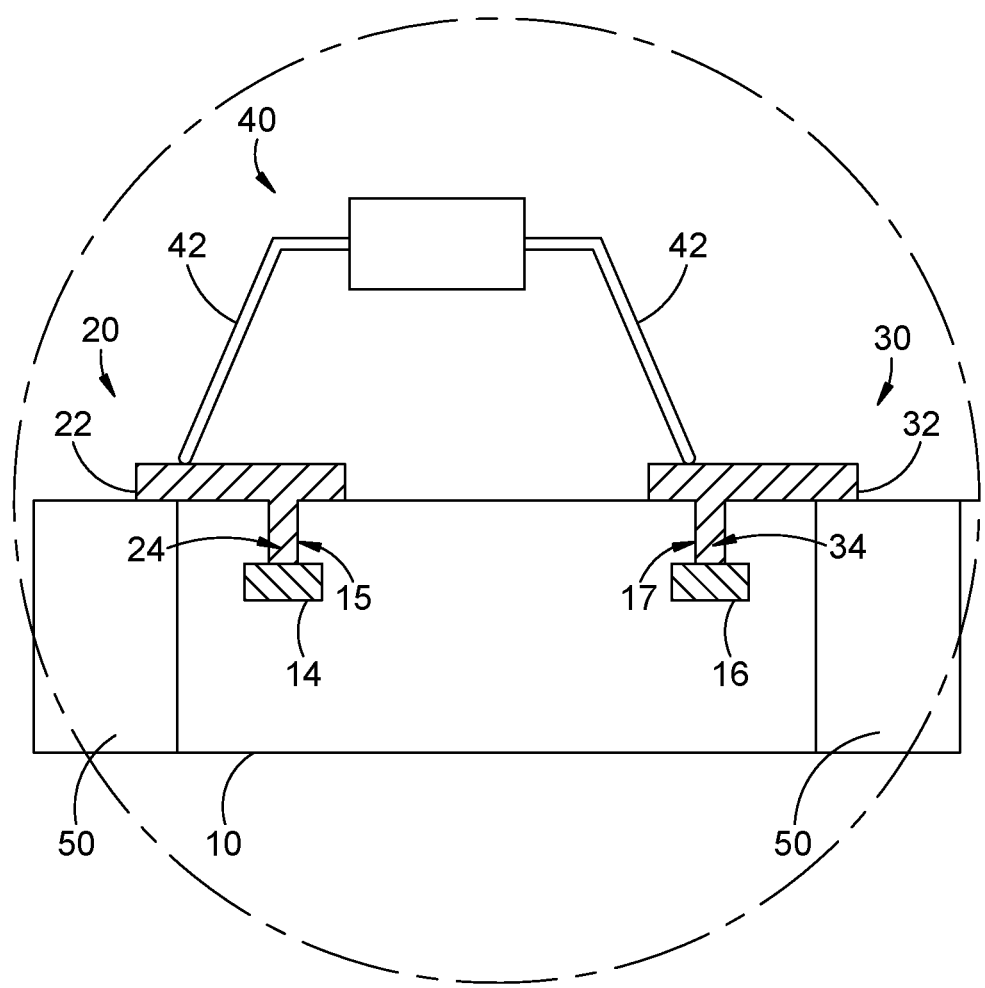
FIG. 7 shows a partially enlarged view of FIG. 6.

Please refer to FIG. 5, FIG. 6, and FIG. 7. FIG. 5 and FIG. 6 show a top view and a cross-sectional view of the test pad structure of chip according to the second embodiment of the present invention; FIG. 7 shows a partially enlarged view of FIG. 6. As shown in the figures, the first body 22 of the first extended test pad 20 extends away from the second extended test pad 30 and beyond the chip 10 to the scribe lane 50, and thus further increasing the area of the first body 22. Likewise, the second body 32 of the second extended test pad 30 extends away from the first extended test pad 20 and beyond the chip 10 to the scribe lane 50, and thus further increasing the area of the second body 32.

Figure 8:
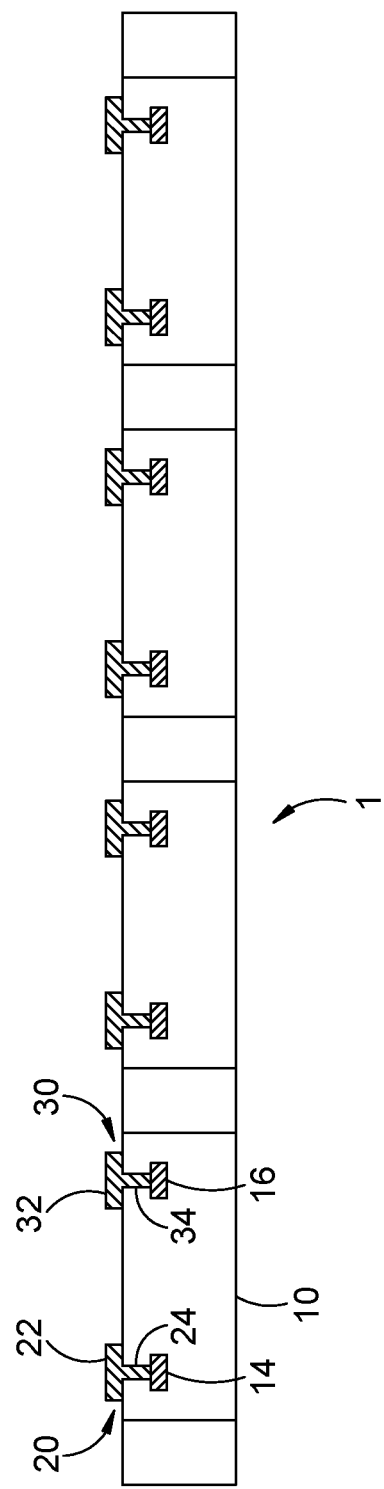
FIG. 8 shows a cross-sectional view of the test pad structure of chip after removing a portion of the extended test pads according to an embodiment of the present invention.

Please refer to FIG. 8, which shows a cross-sectional view of the test pad structure of chip after removing a portion of the extended test pad according to an embodiment of the present invention. After the testing apparatus finishes testing the chips 10 on the wafer 1, a portion of the first body 22 of the first extended test pad 20 and a portion of the second body 32 of the second extended test pad 30 may be removed. Thereby, the chips 10 cut from the wafer 1 still maintain the first extended test pad 20 and the second extended test pad 30 for testing the chip 10. According to another embodiment, the first extended test pad 20 and the second extended test pad 30 may be removed completely. In other words, the first body 22, the first connecting member 24, the second body 32, and the second connecting member 34 are removed completely. According to still another embodiment, the material of the first extended test pad 20 and the second extended test pad 30 may be different from the material of the first internal test pad 14 and the second internal test pad 16. Thereby, by using specific etchants, the first extended test pad 20 and the second extended test pad 30 will be removed without removing the first internal test pad 14 and the second internal test pad 16.

To sum up, the present invention provides a test pad structure of chip, which comprises the extended test pads connecting with the internal test pads. Thereby, probes may transmit signals or power to the internal test pads by contacting the extended test pads for testing chips.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:

1. A test pad structure of chip, comprising:
a plurality of first internal test pads, disposed in a chip;
a plurality of second internal test pads, disposed in said chip, and spaced with said first internal test pads by a distance;
a plurality of first extended test pads, disposed on said chip, connected with said first internal test pads, and located above said first internal test pads; and
a plurality of second extended test pads, disposed on said chip, connected with said second internal test pads, and located above said second internal test pads;
wherein said first and second extended test pads transmit signals or power to said first and second internal test pads.

2. The test pad structure of chip of claim 1, wherein an area of said first extended test pads is greater than an area of said first internal test pads.

3. The test pad structure of chip of claim 1, wherein an area of said second extended test pads is greater than an area of said second internal test pads.

4. The test pad structure of chip of claim 1, wherein a length of said first extended test pads is greater than a length of said first internal test pads.

5. The test pad structure of chip of claim 1, wherein a length of said second extended test pads is greater than a length of said second internal test pads.

6. The test pad structure of chip of claim 1, wherein a width of said first extended test pads is equal to or greater than a width of said first internal test pads.

7. The test pad structure of chip of claim 1, wherein a width of said second extended test pads is equal to or greater than a width of said second internal test pads.

8. The test pad structure of chip of claim 1, wherein said first extended test pads extend toward said second extended test pads.

9. The test pad structure of chip of claim 1, wherein said second extended test pads extend toward said first extended test pads.

10. The test pad structure of chip of claim 1, wherein said first extended test pads extend away from said second extended test pads.

11. The test pad structure of chip of claim 1, wherein said second extended test pads extend away from said first extended test pads.

12. The test pad structure of chip of claim 1, wherein a distance between a side surface of said first extended test pads and a side surface of said chip is smaller than a distance between a side surface of said first internal test pads and said side surface of said chip.

13. The test pad structure of chip of claim 1, wherein a distance between a side surface of said second extended test pads and a side surface of said chip is smaller than a distance between a side surface of said second internal test pads and said side surface of said chip.

14. The test pad structure of chip of claim 1, wherein said first extended test pads or/and said second extended test pads extend beyond said chip; and said first internal test pads and said second internal test pads are located inside said chip.

15. The test pad structure of chip of claim 1, wherein said first extended test pads include a first side surface and a second side surface; said second extended test pads include a first side surface and a second side surface; said second side surface of said first extended test pads is opposite to said second side surface of said second extended test pads; said first side surface of said first extended test pads and said first side surface of said second extended test pads are spaced by a first test distance; said second side surface of said first extended test pads and said second side surface of said second extended test pads are spaced by a second test distance; said first test distance is greater than said second test distance; a testing apparatus includes two probes spaced by a probe distance; said first test distance is greater than said probe distance; and said second test distance is smaller than said probe distance.

16. The test pad structure of chip of claim 1, wherein said first extended test pads, respectively, include:
   a first body; and
   a first connecting member, connected with said first body and said first internal test pad.

17. The test pad structure of chip of claim 1, wherein said second extended test pads, respectively, include:
   a second body; and
   a second connecting member, connected with said second body and said second internal test pad.

* * * * *